United States Patent
Jung

(10) Patent No.: US 10,650,908 B2
(45) Date of Patent: May 12, 2020

(54) SEMICONDUCTOR DEVICE AND SYSTEM INCLUDING THE SAME

(71) Applicant: SK hynix Inc., Icheon-si, Gyeonggi-do (KR)

(72) Inventor: Young Mok Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 49 days.

(21) Appl. No.: 15/955,026

(22) Filed: Apr. 17, 2018

(65) Prior Publication Data

US 2019/0164624 A1    May 30, 2019

(30) Foreign Application Priority Data

Nov. 28, 2017  (KR) .......................... 10-2017-0160872

(51) Int. Cl.
| | |
|---|---|
| *H03M 13/00* | (2006.01) |
| *G11C 29/44* | (2006.01) |
| *G11C 11/409* | (2006.01) |
| *G11C 29/20* | (2006.01) |
| *G11C 29/36* | (2006.01) |

(Continued)

(52) U.S. Cl.
CPC ............ *G11C 29/44* (2013.01); *G11C 11/409* (2013.01); *G11C 29/006* (2013.01); *G11C 29/025* (2013.01); *G11C 29/12005* (2013.01); *G11C 29/20* (2013.01); *G11C 29/36* (2013.01); *G11C 29/40* (2013.01); *H01L 22/14* (2013.01); *G11C 2029/0403* (2013.01); *G11C 2029/0409* (2013.01); *G11C 2029/1202* (2013.01); *G11C 2029/1204* (2013.01); *G11C 2029/1206* (2013.01); *G11C 2029/5602* (2013.01)

(58) Field of Classification Search
CPC ......... G11C 29/44; G11C 29/20; G11C 29/36; G11C 29/14; G11C 29/006; G11C 29/025; G11C 29/12005; G11C 29/40; G11C 2029/1204; G11C 2029/1206; G11C 2029/0403; G11C 2029/0409; G11C 2029/1202; G11C 2029/5602
See application file for complete search history.

(56) References Cited

U.S. PATENT DOCUMENTS

| | | | |
|---|---|---|---|
| 6,567,939 B1 | 5/2003 | Kim | |
| 2003/0002365 A1* | 1/2003 | Sato | ...................... G11C 29/006 365/201 |

(Continued)

FOREIGN PATENT DOCUMENTS

| | | |
|---|---|---|
| KR | 1020010001143 A | 1/2001 |
| KR | 1020070104165 A | 10/2007 |

*Primary Examiner* — Samir W Rizk
(74) *Attorney, Agent, or Firm* — William Park & Associates Ltd.

(57) ABSTRACT

A semiconductor device and a system including the semiconductor device are disclosed, which relate to a technology for detecting a defective or failed part during a probe test of the semiconductor device. The semiconductor device includes a test controller configured to perform counting of a read flag signal during activation of a test signal and to control a data mask signal to be toggled at an N-th activation time of the read flag signal. The semiconductor device further includes a cell array configured to receive and store an output signal of the test controller through a data line during a write operation and to output the stored data to a test device during a read operation.

20 Claims, 5 Drawing Sheets

(51) Int. Cl.
  *H01L 21/66* (2006.01)
  *G11C 29/00* (2006.01)
  *G11C 29/02* (2006.01)
  *G11C 29/40* (2006.01)
  *G11C 29/12* (2006.01)
  G11C 29/04 (2006.01)
  G11C 29/56 (2006.01)

(56) References Cited

U.S. PATENT DOCUMENTS

2003/0043664 A1* 3/2003 Haraguchi ............. G11C 29/44
                                                             365/201
2018/0342308 A1* 11/2018 Tanaka ................... G11C 29/46

* cited by examiner

SEMICONDUCTOR DEVICE AND SYSTEM INCLUDING THE SAME

CROSS-REFERENCE TO RELATED APPLICATION

This application claims priority based upon Korean patent application No. 10-2017-0160872, filed on Nov. 28, 2017, the disclosure of which is hereby incorporated herein by reference in its entirety.

BACKGROUND OF THE INVENTION

1. Field of the Invention

Embodiments of the present disclosure may generally relate to a semiconductor device and a system including the same, and more particularly to a technology for detecting a defective or failed part during a probe test of the semiconductor device.

2. Description of Related Art

With the rapid development of semiconductor devices having lighter weights, smaller sizes, and/or lower costs, semiconductor devices have been widely used in various industrial fields, for example, in electronic devices, vehicles, and/or vessels, etc. Higher reliability and a higher degree of integration of semiconductor devices are of importance to the performance of electronic equipment including the semiconductor devices.

Electronics industries have rapidly developed to implement semiconductor devices having a higher degree of integration and greater reliability. Therefore, many developers and companies are conducting intensive research into high-reliability semiconductor devices and methods for testing the same.

Generally, a semiconductor manufacturing process may be broadly classified into a fabrication process and an assembly process. The fabrication process may form an integrated circuit (IC) pattern on a wafer. The wafer must enter a test process for detecting the presence or absence of a defective or failed part in a semiconductor device constructing the wafer, prior to entering a packaging process. The assembly process is a process for packaging wafer-based semiconductor chips (hereinafter referred to as semiconductor devices) formed by the fabrication process. Currently, testing processes for semiconductor devices can be time consuming and involve costly equipment.

BRIEF SUMMARY OF THE INVENTION

Teachings of the present disclosure are directed to providing a semiconductor device and a system including the same that substantially obviate one or more problems due to limitations and disadvantages of the related art.

Embodiments of the present disclosure relate to a technology for detecting a defective or failed part of a data mask line during a probe test of a semiconductor device.

In accordance with an embodiment of the present disclosure, a semiconductor device includes a test controller configured to perform counting of a read flag signal during activation of a test signal and to control a data mask signal to be toggled at an N-th activation time of the read flag signal. The semiconductor device further includes a cell array configured to receive and store an output signal of the test controller through a data line during a write operation and to output the stored data to a test device during a read operation.

In accordance with another embodiment of the present disclosure, a system includes a semiconductor device configured to perform counting of a read flag signal during activation of a test signal and to transmit a data mask signal to be toggled at an N-th activation time of the read flag signal to a cell array through a data line. The system also includes a test device configured to output the test signal to the semiconductor device and to test a failed part of data received from the semiconductor device.

In one case, the semiconductor device performs a background write operation in the cell array when entering a parallel test mode. The semiconductor device also reads or writes data from or writes data in the cell array during activation of the test signal upon completion of the parallel test mode and tests a failed part of the data mask signal.

It is to be understood that both the foregoing general description and the following detailed description of the present disclosure are exemplary and explanatory and are intended to provide support for the included clams.

BRIEF DESCRIPTION OF THE DRAWINGS

The above and other features and advantages of the present disclosure will become readily apparent by reference to the following detailed description when considered in conjunction with the accompanying drawings wherein.

DETAILED DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions.

Figure 1:
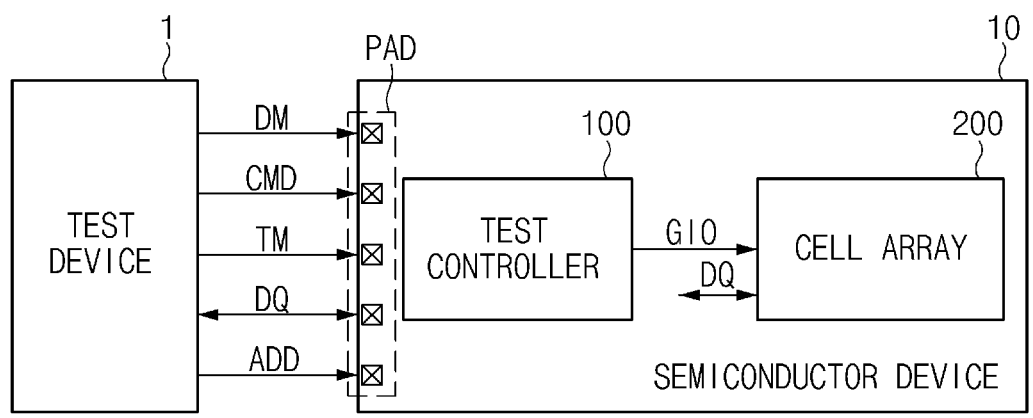
FIG. 1 shows a block diagram of a system including a semiconductor device according to an embodiment of the present disclosure.

FIG. 1 shows a block diagram of a system including a semiconductor device according to an embodiment of the present disclosure.

Referring to FIG. 1, the system may include a test device 1 and a semiconductor device 10.

The test device 1 may be a device for testing a function of the semiconductor device 10. For example, the test device 1 may screen a defective (or failed) part of each data line of the semiconductor device 10 by testing the function.

The test device 1 may perform a probe test at a wafer level to verify an operation of the semiconductor device 10. The test device 1 may apply an electrical signal to the semiconductor device 10, may analyze a response signal to the applied electrical signal, and may determine, based on the analysis, whether there is a defective or failed part in the semiconductor device 10.

The test device 1 may transmit a data mask signal DM, a command signal CMD, a test signal TM, and/or an address ADD to the semiconductor device 10. The test device 10 may also transmit and receive data DQ to and from the semiconductor device 10.

The command signal CMD may include a plurality of signals needed to transmit commands to the semiconductor device 10, for example, an active command signal, a row address strobe signal, a column address strobe signal, a write enable signal, a read enable signal, etc. In addition, the address ADD may be used to select a portion to be accessed by the semiconductor device 10, or may be used to establish various setting information of the semiconductor device 10.

The test signal TM may be used to establish a test mode of the semiconductor device 10 to be used as a test target. The test device 10 may change the test mode to any one of various modes to test for a defective or failed part of the semiconductor device 10.

The data mask signal DM might not be used in a read operation of the semiconductor device 10 in some embodiments, but it may be used in a write operation of the semiconductor device 10. The data mask signal DM may be used in proportion to the increasing data processing capacity and data processing speed of the semiconductor device 10. The data mask signal DM may mask a specific memory cell at a specific time during the write operation.

That is, when data stored in the semiconductor device 10 need not be changed according to a data pattern, the data mask signal DM may prevent some parts of input data received through a data pad PAD from being applied to an internal circuit. When the data mask signal DM is activated in response to the write command from among the command signals CMD, the semiconductor device 10 may prevent input of undesired data unscheduled to be written.

The test device 1 may transmit the data mask signal DM, the command signal CMD, the test signal TM, the address ADD, and the data DQ to the corresponding pads PAD of the semiconductor device 10. To test for a defective or failed part in the semiconductor device 10, the test device 1 may determine whether or not the data DQ generated from the semiconductor device 10 is normal.

The semiconductor device 10 may include a test controller 100 and a cell array 200, as indicated in FIG. 1.

The semiconductor device 100 may receive each of the data mask signal DM, the command signal CMD, the test signal TM, the address ADD, and the data DQ through the specifically allocated pads PAD, may generate internal data, may transmit the internal data to a data line, and may store the internal data in the cell array 200.

The semiconductor device 10, such as a Dynamic Random Access Memory (DRAM), may pass through a test step for detecting a defective or failed part of a circuit in a wafer stage and a package stage. After several semiconductor devices are designed on a wafer, the external test device 1 may test some semiconductor devices (i.e., cells for testing), selected from among the semiconductor devices, through a test pattern formed in some regions of the wafer. This test carried out by the test device 1 will hereinafter be referred to as a wafer-level test.

The test controller 100 may screen a defective part of a data line GIO configured to receive the data mask signal DM during the probe test at the wafer level. During a write operation, the cell array 200 may write data of the data line GIO and the data DQ received from the test device 1. During a read operation, the cell array 200 may read the stored data DQ.

For one embodiment, the test signal TM is activated during a probe test mode. The test signal TM, for example, is a signal for testing for a failed part of the data mask signal DM at a wafer level.

Figure 2:
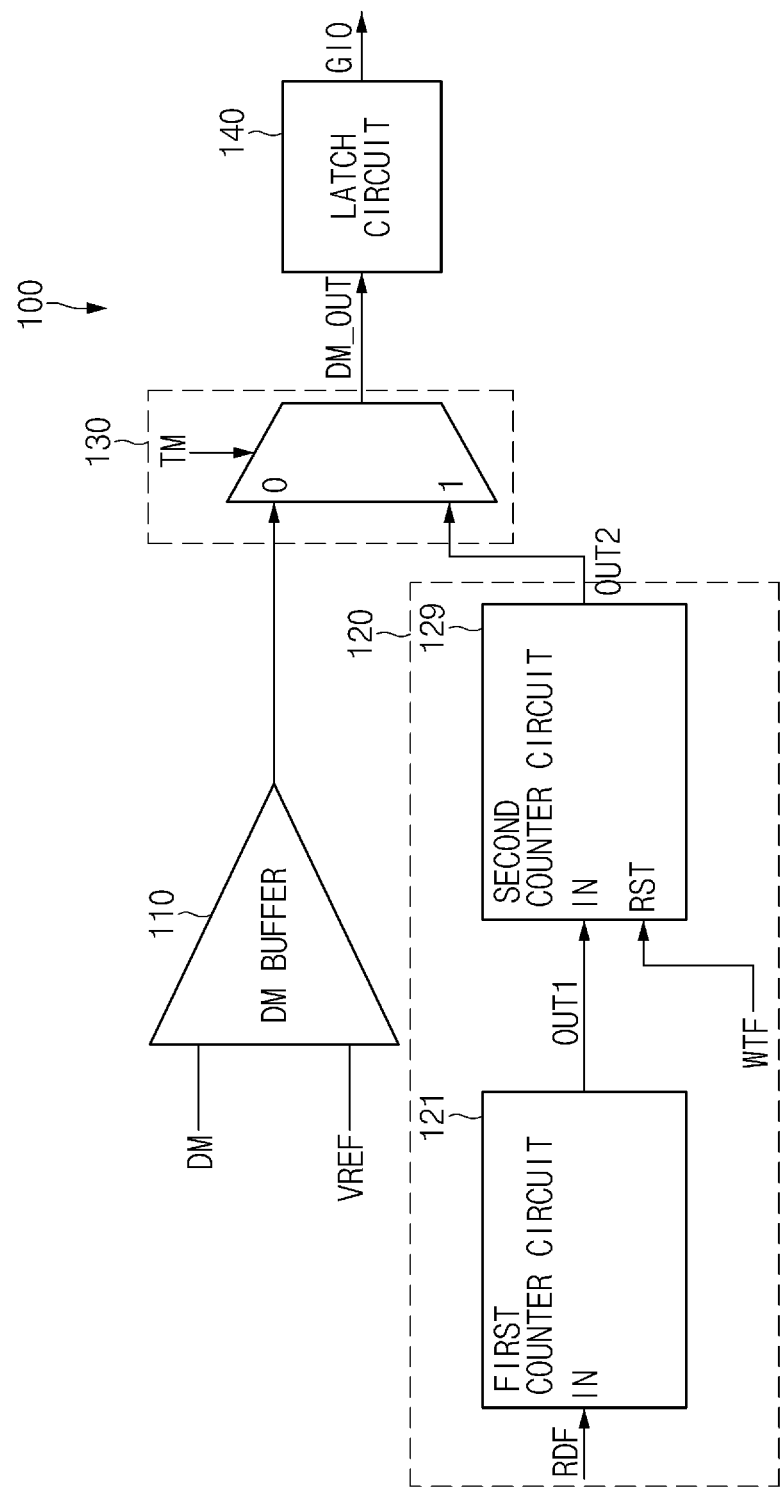
FIG. 2 shows a detailed block diagram of a test controller illustrated in FIG. 1.

FIG. 2 shows a detailed block diagram illustrating an example of the test controller 100 pictured in FIG. 1.

Referring to FIG. 0.2, the test controller 100 may include a data mask signal (DM) buffer 110, a test pulse generation circuit 120, a selection circuit 130, and a latch circuit 140.

The DM buffer 110 may buffer the data mask signal DM in response to a reference signal VREF. The test pulse generation circuit 120 may output a counting signal OUT2 in response to receiving a read flag signal RDF and a write flag signal WTF.

In this case, the read flag signal RDF may be activated in response to a read enable signal from among the command signals CMD received from the test device 1. The write flag signal WTF may be activated in response to a write enable signal from among the command signals CMD received from the test device 1.

The test pulse generation circuit 120 may include a first counter circuit 121 and a second counter circuit 129.

In this case, the first counter circuit 121 may count N bits in response to the read flag signal RDF, and may thus output a counting signal OUT1. The first counter circuit 121 may perform counting during activation of the read flag signal RDF. The first counter circuit 121 may output the counting signal OUT1 and may toggle the counting signal OUT1 on or off at an N-th activation time of the read flag signal RDF. The first counter circuit 121 may be reset at an (N+1)-th activation time of the read flag signal RDF.

The second counter circuit 129 may count the counting signal OUT1, and based on this, may output a counting signal OUT2. The second counter circuit 129 may include a 1-bit counter that performs 1-bit counting to output the counting signal OUT2. The second counter circuit 129 may reset the counting operation in response to the write flag signal WTF. That is, the second counter circuit 129 may start the counting operation during activation of the counting signal OUT1 and may stop the counting operation in response to the write flag signal WTF.

The selection circuit 130 may select any one of the output signal of the DM buffer 110 and the output signal of the test pulse generation circuit 120 in response to the test signal TM, and may output an output signal DM_OUT. For example, when the test signal TM is at a low level, the selection circuit 130 may select the output signal of the DM buffer 110, and may output the output signal DM_OUT. In contrast, when the test signal TM is at a high level, the selection circuit 130 may select the counting signal OUT2, and may output the output signal DM_OUT.

In this case, the test signal TM may include a parallel test mode TPARA, a fail detection test mode, etc. The parallel test mode TPARA may refer to a mode for activating all banks during the probe test. The parallel test mode TPARA may be used to reduce the amount of time consumed for the test. Data compressed in the cell array 200 of the semiconductor device 10 is written or read during the parallel test mode TPARA, such that the test controller 100 may determine whether each cell of the cell array 200 is operating normally.

For various embodiments, a low level and a high level of a signal, such as the test signal TM, refer to voltage levels of the signal as measured relative to one another. The low-level voltage of the signal, for example, corresponds to a first voltage which is less than a second voltage corresponding to the high-level voltage of the signal. In further embodiments, signals can be toggled between their low and high levels.

The fail detection test mode may refer to a test mode for screening a defective or failed part of the data mask signal DM. Although the parallel test mode TPARA may reduce the time consumed for a test by compressing, writing, and reading data, for an embodiment, the parallel test mode TPARA is unable to test whether a defective or failed part occurs in the data mask signal (DM) line. Therefore, for the embodiment, the test controller 100 can be used to screen the defective or failed part of the data mask signal DM during the probe test.

The latch circuit 140 may latch the output signal (DM_OUT) and may output the latched output signal (DM_OUT) to the data line GIO. The latch circuit 140 may latch and align the output signal (DM_OUT) and may output the aligned latch data to the data line GIO.

For one embodiment, the latch circuit 140 included in the semiconductor device 10 is configured to latch the output signal of the selection circuit 130 and to output the latched output signal to the data line.

In another embodiment, the test pulse generation circuit 120 included in the test controller 100 further includes the first counter circuit 121, configured to output the first counting signal by counting the read flag signal, and the second counter circuit 129, configured to output the second counting signal by counting the first counting signal. For one case, the first counter circuit 121 is an N-bit counter. In another case, the second counter circuit 129 is a 1-bit counter. In some instances, the second counter circuit 129 is reset in response to the write flag signal.

Figure 3:
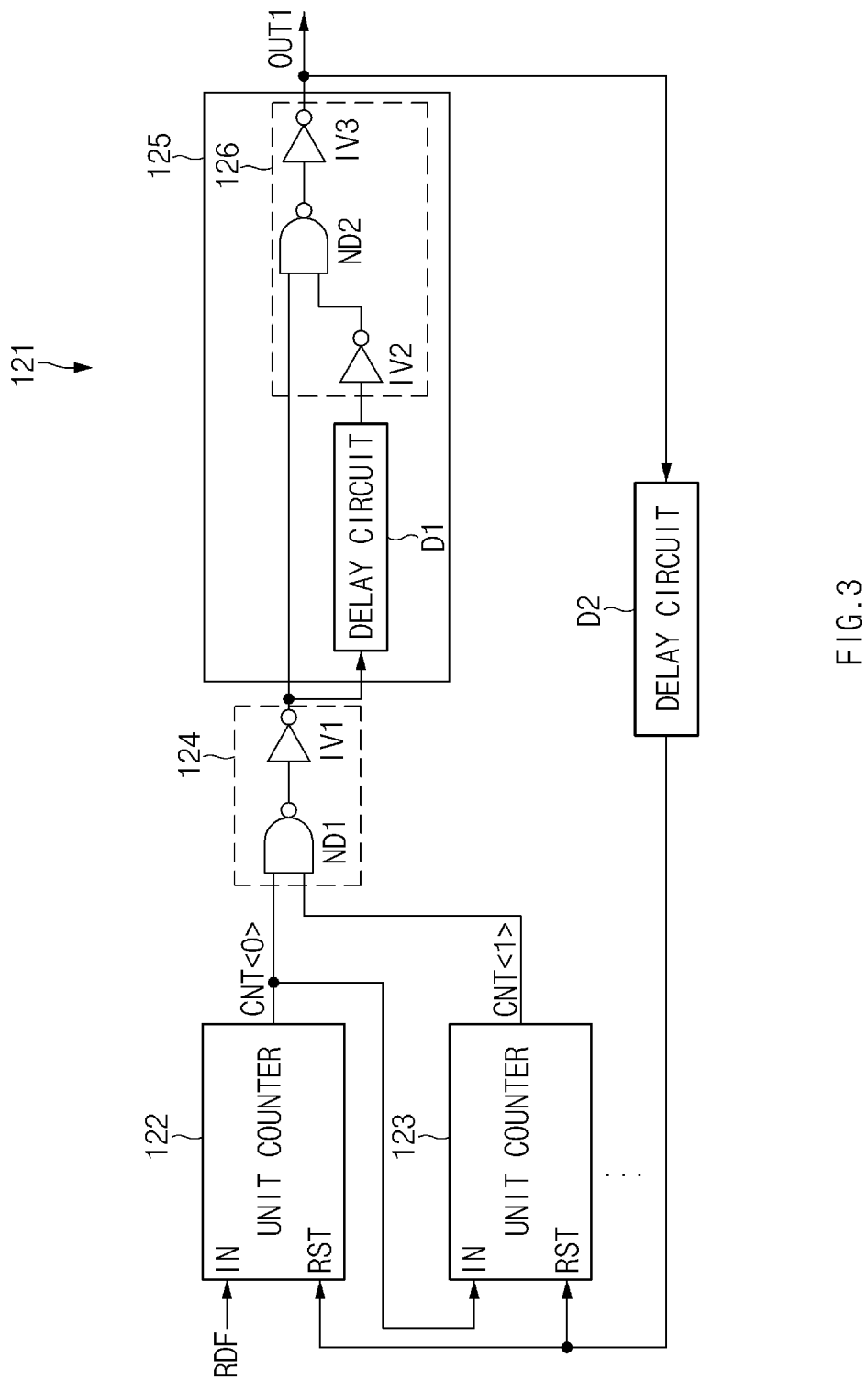
FIG. 3 shows a detailed circuit diagram of the first counter circuit indicated in FIG. 2.

FIG. 3 shows a detailed circuit diagram illustrating the first counter circuit 121 pictured in FIG. 2.

Referring to FIG. 3, the first counter circuit 121 may include a plurality of unit counters 122 and 123, a counting signal combination circuit 124, a pulse width control (PWM) circuit 125, and a delay circuit D2.

Although the first counter circuit 121 may include additional unit counters, only two unit counters 122, 123 are shown in FIG. 3 for convenience of description and better understanding of the present disclosure. The unit counters 122, 123 may count input signals, and may thus sequentially output a plurality of unit counting signals CNT<0> and CNT<1>. The unit counting signal CNT<0> generated by the unit counter 122 may be input to an input terminal IN of the unit counter 123.

The unit counter 122, for example, may perform a counting operation in response to the read flag signal RDF and may output the unit counting signal CNT<0>. The unit counter 123 may perform counting in response to the unit counter signal CNT<0> and may responsively output the unit counter signal CNT<1>.

For convenience of description and better understanding of the present disclosure, it may be assumed for some embodiments of the present disclosure that each of the unit counters 122 and 123 is implemented as a 1-bit counter configured to perform 1-bit counting. Each unit counter 122, 123 may be reset by an output signal of the delay circuit D2.

The counting signal combination circuit 124 may perform a logical operation between the plurality of unit counting signals CNT<0> and CNT<1>. The counting signal combination circuit 124 may perform a logical AND operation between the plurality of unit counting signals CNT<0> and CNT<1>. In other words, the counting signal combination circuit 124 may include a NAND gate ND1 and an inverter IV1. The NAND gate ND1 may perform a logic NAND operation between the plurality of unit counting signals CNT<0> and CNT<1>. The inverter IV1 may invert an output signal of the NAND gate ND1.

The PWM circuit 125 may generate the counting signal OUT1 having a predetermined pulse width in response to the output signal of the counting signal combination circuit 124. The PWM circuit 125 may include a delay circuit D1 and a combination circuit 126.

The delay circuit D1 may delay the output signal of the counting signal combination circuit 124 by a predetermined time. The combination circuit 126 may combine the output signal of the counting signal combination circuit 124 and the output signal of the delay circuit D1, and may thus output the counting signal OUT1. In this case, the combination circuit 126 may include a NAND gate ND2 and inverters IV2 and IV3. The inverter IV2 may invert the output signal of the delay circuit D1. The NAND gate ND2 may perform a logic NAND operation between the output signal of the counting signal combination circuit 124 and the output signal of the inverter IV2. The inverter IV3 may output the counting signal OUT1 by inverting the output signal of the NAND gate ND2.

The delay circuit D2 may delay the counting signal OUT1 by a predetermined time and may output the delayed counting signal OUT1 to a reset terminal RST of each of the unit counters 122, 123. That is, the delay circuit D2 may delay the counting signal OUT1 by the predetermined time and may thus enable each unit counter 122 or 123 to be reset after the lapse of a time period in which the counting signal OUT1 is activated.

In an embodiment, the pulse width control PWM circuit 125 includes the second delay circuit D1, which is configured to delay the output signal of the counting signal combination circuit 124 by the predetermined time. The pulse width control PWM circuit 125 also includes the combination circuit 126, which is configured to combine an output signal of the second delay circuit D1 and the output signal of the counting signal combination circuit 124.

Figure 4:
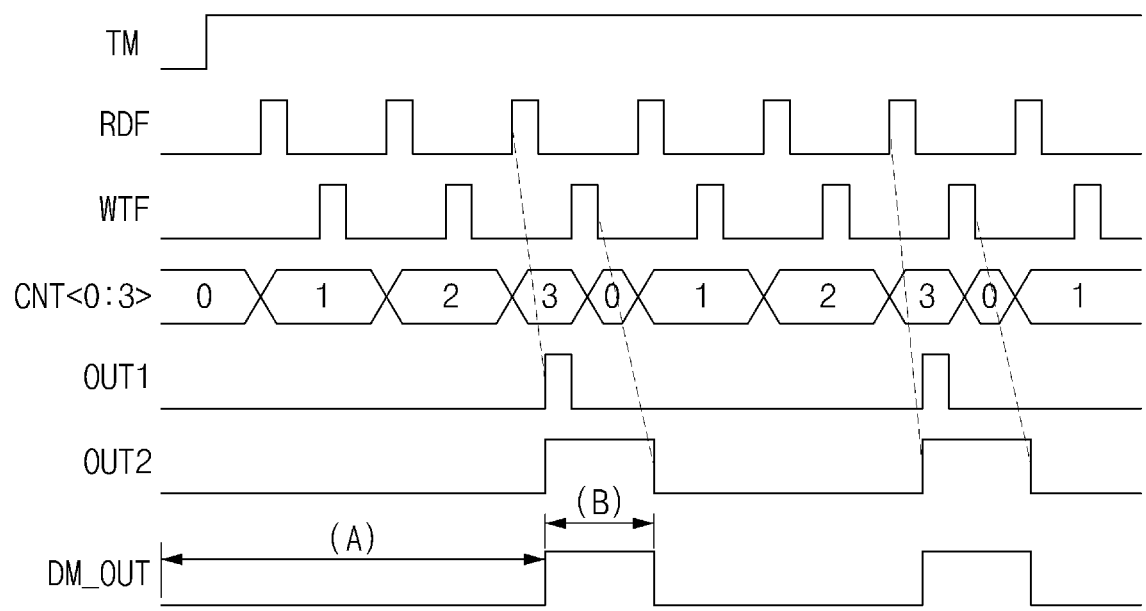
FIG. 4 shows a timing diagram illustrating operations of the test controller indicated in FIG. 1.

FIG. 4 shows a timing diagram illustrating operations of the test controller 100 pictured in FIG. 1.

Referring to FIG. 4, when the test signal TM is activated to a high level, the test controller 100 may enter the fail detection test mode for screening a defective or failed part of the data mask signal DM.

Thereafter, in response to the read enable signal from among the command signals CMD received from the test device 1, each pulse of the read flag signal RDF may be activated at intervals of a predetermined time. After that, in response to the write enable signal from among the command signals CMD received from the test device 1, each pulse of the write flag signal WTF may be activated at intervals of a predetermined time. The predetermined times for the read flag signal RDF and the write flag signal WTF may be the same or different.

The first counter circuit 121 may perform counting of N bits (e.g., 3 bits) during activation of the first read flag signal RDF. That is, the first counter circuit 121 may perform counting of the counting signal CNT<0:1> in the order of "00"-"01"-"10". When the last unit counting signal CNT<0:1> of 3 bits is counted as "11", the counting signal OUT1 may be activated.

In an embodiment of the present disclosure, a timing point for toggling the data mask signal DM may be adjusted according to a pattern of the corresponding device. Within the same bank, for example, a first read operation, a write operation of data "1", a second read operation, a write operation of data "0", a third read operation, and a write operation of data "1" (data mask signal DM) are sequentially carried out. As a result, the toggling period of the data mask signal DM may be changed at intervals of the third read operation. Therefore, the first counter circuit 121 may be a 3-bit counter.

When the first counter circuit 121 is a 3-bit counter, for instance, the counting signal OUT1 may be activated to a high level in response to a third read flag signal RDF. That is, the counting signal OUT1 may be enabled by synchronizing with the third read flag signal RDF disabled to a low level. In this case, a high-level pulse width of the counting signal OUT1 may be adjusted by a delay time of the delay circuit D1 of the PWM circuit 125.

After lapse of a delay time of a second delay circuit D2 upon activation of the counting signal OUT1, each of the unit counters 122 and 123 may be reset, and the unit counting signal CNT<0> may be set to zero "0". That is, a reset timing of each unit counter 122 or 123 may be adjusted in response to the delay time of the delay circuit D2.

Thereafter, the second counter 129 may perform 1-bit counting of the counting signal OUT1 and may responsively activate the counting signal OUT2. The counting signal OUT2 may be deactivated in response to a third write flag signal WTF while being kept at a high-level pulse. In other words, the counting signal OUT2 may be activated (or enabled) to a high level by synchronizing with the enabled counting signal OUT1 and may be deactivated in response to a disablement time of the third write flag signal WTF, as indicated by broken lines in FIG. 4.

When the test signal TM is at a high level, the selection circuit 130 may output the counting signal OUT2 and may thus output an output signal DM_OUT. That is, the output signal DM_OUT may be kept at a low level during a time period (A) in which the first read flag signal RDF and the second read flag signal RDF are activated. During a time period (B) in which the third read flag signal RDF is activated, the output signal DM_OUT may be activated to a high level, such that the selection circuit 130 may enter the fail detection test mode. In addition, the output signal DM_OUT may be deactivated to a low level in response to a disablement time of the third write flag signal WTF.

In one embodiment, the first counting signal is activated in response to the N-th read flag signal RDF and is deactivated after lapse of the predetermined delay time. In another embodiment, the second counting signal is activated in response to the N-th read flag signal RDF and is deactivated in response to the write flag signal WTF.

For one case, the test controller enables the data mask signal DM to a high level during an N-th activation time of the read flag signal RDF and outputs the high-level data mask signal DM to the data line. In another case, the test signal TM is activated upon completion of the parallel test mode TPARA.

Figure 5:
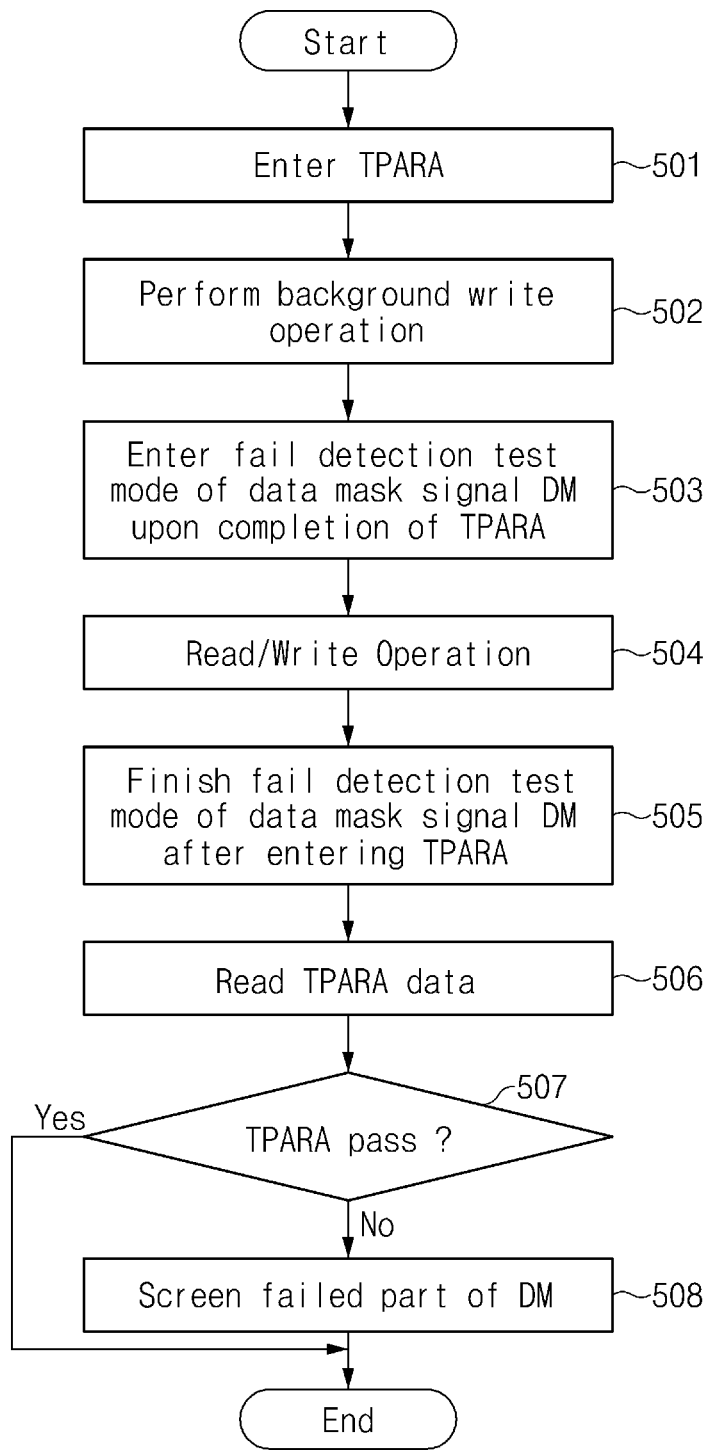
FIG. 5 shows a flowchart illustrating a method for operating a semiconductor device according to an embodiment of the present disclosure.

FIG. 5 shows a flowchart illustrating a method for operating a semiconductor device according to an embodiment of the present disclosure.

Referring to FIG. 5, the semiconductor device may enter 501 a parallel test mode TPARA and may perform 502 a background write operation for storing the same data in the cell array 200.

The background write operation used in the parallel test mode TPARA will hereinafter be described. For example, when a 4-bit compression test is performed in the parallel test mode TPARA, data is input to four input/output (I/O) lines through a single input pad such that data is written in the cell array 200. During the parallel test mode TPARA, the semiconductor device may perform a comparison between output data of four I/O lines, may compress the result of comparison as one data, and may output the compressed data through the I/O pad.

When output data from the four I/O lines is identical to each other, high (H)-level data may be output through the I/O pad. When the output data from the four I/O lines are different from each other, low (L)-level data may be output through the I/O pad.

As described above, compression data is transmitted to four I/O lines such that the transmitted compression data are written in the cell array 200. The output data from the cell array 200 may be compressed on the basis of four I/O lines, and the result of comparison may be output. Therefore, it may be possible to test the semiconductor device using a smaller number of I/O pads, and it may also be possible to test various dies using a smaller number of I/O lines, resulting in a reduction of time consumed for such testing.

Upon completion of the parallel test mode TPARA, the semiconductor device may enter 503 a fail detection test mode for detecting a defective or failed part of the data mask signal DM. During the fail detection test mode, the data mask signal DM may be fixed to a low level during the time period (A) and may be fixed to a high level during the time period (B), as illustrated in the timing diagram of FIG. 4. When the semiconductor device enters the fail detection test mode, the semiconductor device may read 504 data stored in the cell array 200 and may re-write 504 data in the cell array 200 in a manner that allows the data read operation and the data write operation to be repeated.

Subsequently, when the semiconductor device re-enters the parallel test mode TPARA, the semiconductor device may finish 505 and stop the fail detection test mode. When the semiconductor device enters the parallel test mode TPARA, data stored in the cell array 200 may be read 506 again. The test device 1 may analyze data read from the semiconductor device 10 to determine 507 whether the data is in a pass or fail state during the parallel test mode TPARA. When the data detected in the parallel test mode TPARA is determined to be fail data, the test device 1 may detect or screen 508 a defective or failed part in the read data during the fail detection test mode for the data mask signal DM.

During screening of a defective or failed part of the data line GIO during the wafer test for some embodiments, it may be difficult, impractical, or even impossible to support a data mask signal DM/DBI (Data Bus Inversion) pin. Therefore, in order to improve test efficiency when the semiconductor device is tested on a wafer, the operation for testing the data mask signal DM may be omitted as necessary. Generally, in order to detect a defective or failed part on a normal write/read path of the data mask signal DM/DBI, the output signal of the data mask signal DM may be fixed to a first level (high level) or to a second level (low level) such that the operation for screening defective or failed part(s) of the parallel test mode TPARA and the data line GIO may be carried out.

In this case, the operation for testing and determining the defective or failed part needs to be repeated several times, resulting in an increased test time. Specifically, when using a device not supporting the scheme in which the data mask signal DM is fixed to a high level or a low level to perform the test, it may be impossible to test the device at a wafer stage (or wafer level), such that the operation for screening the defective or failed part must be performed for the device at a package stage (or package level).

Accordingly, in order to detect the defective or failed part of the data line GIO during the probe test at a wafer level, the semiconductor device and the system including the same according to an embodiment of the present disclosure may allow the data mask signal DM to be mandatorily toggled to a high level or a low level during the read or write operation of data. As a result, it may be possible to test the data mask signal DM during testing of data DQ, resulting in reduction of the entire test time.

As is apparent from the above description, the semiconductor device and the system including the same according to presented embodiments of the present disclosure may screen a defective or failed part of a data mask line during a probe test of the semiconductor device, resulting in reduction of a test time and production costs.

Those skilled in the art will appreciate that presented embodiments may be carried out in other ways than those set forth herein without departing from the spirit and characteristics of the disclosure. Presented embodiments are therefore to be construed in all aspects as illustrative and not restrictive. The scope of the disclosure should be determined by the appended claims and their legal equivalents, not by the above description. Further, all potential embodiments coming within the meaning and equivalency range of the appended claims are intended to be covered by the scope of the claims. In addition, it is obvious to those skilled in the art that the claims may be amended after the application is filed in accordance with matter presented in the detailed description and drawings.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A semiconductor device comprising:
    a test controller configured to perform counting of a read flag signal during activation of a test signal for testing a defective part of a data line, and to control a data mask signal to be toggled at an N-th activation time of the read flag signal; and
    a cell array configured to receive and store an output signal of the test controller through a data line during a write operation, and to output the stored data to a test device during a read operation.

2. The semiconductor device according to claim 1, wherein the test signal is activated during a probe test mode.

3. The semiconductor device according to claim 1, wherein the test signal is a signal for testing for a failed part of the data mask signal at a wafer level.

4. The semiconductor device according to claim 1, wherein the test controller comprises:
    a data mask signal buffer configured to buffer the data mask signal;
    a test pulse generation circuit configured to output a second counting signal by counting the read flag signal; and
    a selection circuit configured to select, upon receiving the test signal, any one of an output signal of the data mask signal buffer and an output signal of the test pulse generation circuit.

5. The semiconductor device according to claim 4 further comprising:
    a latch circuit configured to latch an output signal of the selection circuit, and to output the latched output signal to the data line.

6. The semiconductor device according to claim 4, wherein the test pulse generation circuit comprises:
    a first counter circuit configured to output a first counting signal by counting the read flag signal; and
    a second counter circuit configured to output the second counting signal by counting the first counting signal.

7. The semiconductor device according to claim 6, wherein the first counter circuit is an N-bit counter.

8. The semiconductor device according to claim 6, wherein the second counter circuit is a 1-bit counter.

9. The semiconductor device according to claim 6, wherein the second counter circuit is reset in response to a write flag signal.

10. The semiconductor device according to claim 6, wherein the first counter comprises:
    a plurality of unit counters configured to perform N-bit counting of the read flag signal, and to output a plurality of unit counting signals;
    a counting signal combination circuit configured to combine the plurality of unit counting signals;
    a pulse width control circuit configured to output the first counting signal having a predetermined pulse width in response to an output signal of the counting signal combination circuit; and
    a first delay circuit configured to delay the first counting signal, and to output the delayed first counting signal to a reset terminal of the plurality of unit counters.

11. The semiconductor device according to claim 10, wherein each of the plurality of unit counters is a 1-bit counter.

12. The semiconductor device according to claim 10, wherein the pulse width control circuit comprises:
    a second delay circuit configured to delay the output signal of the counting signal combination circuit by a predetermined time; and
    a combination circuit configured to combine an output signal of the second delay circuit and the output signal of the counting signal combination circuit.

13. The semiconductor device according to claim 6, wherein the first counting signal is activated in response to an N-th read flag signal, and is deactivated after lapse of a predetermined delay time.

14. The semiconductor device according to claim 6, wherein the second counting signal is activated in response to an N-th read flag signal, and is deactivated in response to a write flag signal.

15. The semiconductor device according to claim 1, wherein the test controller enables the data mask signal to a high level during an N-th activation time of the read flag signal, and outputs the high-level data mask signal to the data line.

16. The semiconductor device according to claim 1, wherein the test signal is activated upon completion of a parallel test mode.

17. A system comprising:
    a semiconductor device configured to perform counting of a read flag signal during activation of a test signal for testing a defective part of a data line, and to transmit a data mask signal to be toggled at an N-th activation time of the read flag signal to a cell array through a data line; and
    a test device configured to output the test signal to the semiconductor device, and to test a failed part of data received from the semiconductor device.

18. The system according to claim 17, wherein the semiconductor device performs a background write operation in the cell array when entering a parallel test mode, reads data from or writes data in the cell array during activation of the test signal upon completion of the parallel test mode, and tests a failed part of the data mask signal.

19. The system according to claim 17, wherein the semiconductor device comprises:
- a test controller, wherein the test controller is configured to count the read flag signal, and to control the data mask signal to be toggled at an N-th activation time of the read flag signal; and
- wherein the cell array is included in the semiconductor device, and the cell array is configured to receive/store an output signal of the test controller through the data line during a write operation, and to output the stored data to the test device during a read operation.

20. The system according to claim 19, wherein the test controller comprises:
- a first counter circuit configured to output a first counting signal by counting the read flag signal; and
- a second counter circuit configured to output a second counting signal by counting the first counting signal, and to be reset by the write flag signal.

* * * * *